US012683521B2

(12) United States Patent
Pandit et al.

(10) Patent No.: US 12,683,521 B2
(45) Date of Patent: Jul. 14, 2026

(54) NOISE-LOWERING POWER FET DRIVER

(71) Applicant: Texas Instruments Incorporated,
Dallas, TX (US)

(72) Inventors: Samir Pandit, Sivasagar (IN); **Venkata
Naresh Kotikelapudi,** Bangalore (IN)

(73) Assignee: **TEXAS INSTRUMENTS
INCORPORATED,** Dallas, TX (US)

( * ) Notice: Subject to any disclaimer, the term of this
patent is extended or adjusted under 35
U.S.C. 154(b) by 0 days.

(21) Appl. No.: 18/308,342

(22) Filed: Apr. 27, 2023

(65) Prior Publication Data

US 2024/0364234 A1     Oct. 31, 2024

(51) Int. Cl.
H03K 17/00 (2006.01)
H02M 1/088 (2006.01)
H02M 7/5387 (2007.01)
H03K 17/687 (2006.01)

(52) U.S. Cl.
CPC ....... H02M 7/53871 (2013.01); H02M 1/088
(2013.01); H03K 17/687 (2013.01)

(58) Field of Classification Search
CPC .. H02M 7/53871; H02M 1/088; H03K 17/06;
H03K 17/063; H03K 17/08; H03K
17/082; H03K 17/0822; H03K 17/10;
H03K 17/102; H03K 17/13; H03K
17/133; H03K 17/16; H03K 17/165;
H03K 17/167; H03K 17/30; H03K
17/302; H03K 17/687; H03K 17/6871;
H03K 17/6874
See application file for complete search history.

(56) References Cited

U.S. PATENT DOCUMENTS

| | | | | |
|---|---|---|---|---|
| 6,222,751 B1 * | 4/2001 | Portaluri | ........... | H02M 7/53803 363/133 |
| 2008/0094126 A1 * | 4/2008 | Yamazaki | ............ | H03K 17/042 327/535 |
| 2014/0266123 A1 * | 9/2014 | Rader | ................... | H02M 3/156 323/288 |
| 2018/0017023 A1 * | 1/2018 | Mills | .................... | B60K 15/035 |
| 2018/0109213 A1 * | 4/2018 | Saw | .......................... | H02P 8/34 |
| 2018/0287493 A1 * | 10/2018 | Riva | ................... | H02M 3/1588 |
| 2020/0052586 A1 * | 2/2020 | Price | ....................... | H03K 5/24 |
| 2021/0359674 A1 * | 11/2021 | Keskar | ........... | H03K 17/04206 |
| 2024/0146177 A1 * | 5/2024 | Mehdi | ..................... | H02M 3/07 |
| 2024/0364283 A1 * | 10/2024 | Zhou | ..................... | H03F 1/0227 |

* cited by examiner

*Primary Examiner* — Tuan T Lam
(74) *Attorney, Agent, or Firm* — Xianghui Huang; Frank
D. Cimino

(57) ABSTRACT

In described examples, an integrated circuit includes first
and second transistors, a switch, a capacitor, a resistor, and
first and second comparators. A first terminal of the switch
is coupled to a first terminal of the resistor. A second
terminal of the switch is coupled to a second terminal of the
resistor, a first terminal of the capacitor, and a gate of the first
transistor. The first comparator is configured to receive at the
first input a first reference voltage, and an output of the first
comparator is coupled to a gate of the second transistor. The
second comparator is configured to receive at the first input
a second reference voltage. A second input of the second
comparator is coupled to a second input of the first com-
parator. An output of the second comparator is coupled to a
control input of the switch.

20 Claims, 10 Drawing Sheets

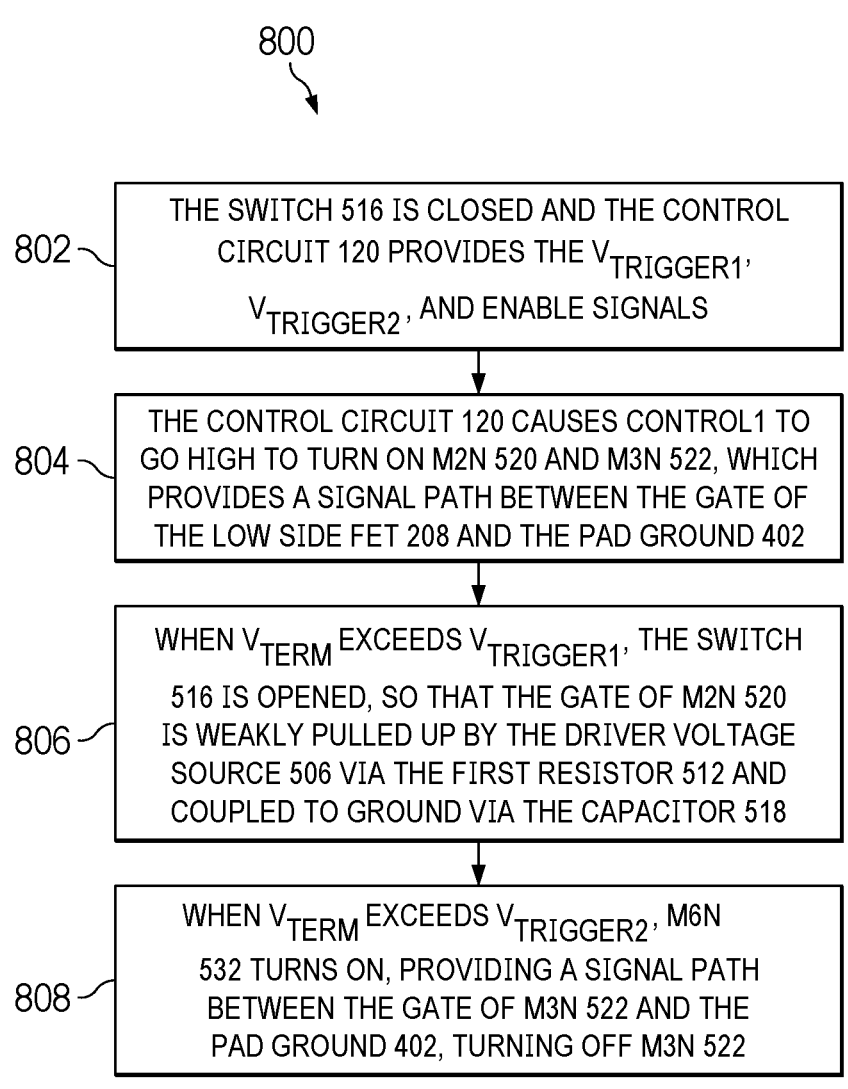

800

802 — THE SWITCH 516 IS CLOSED AND THE CONTROL CIRCUIT 120 PROVIDES THE $V_{TRIGGER1}$, $V_{TRIGGER2}$, AND ENABLE SIGNALS

804 — THE CONTROL CIRCUIT 120 CAUSES CONTROL1 TO GO HIGH TO TURN ON M2N 520 AND M3N 522, WHICH PROVIDES A SIGNAL PATH BETWEEN THE GATE OF THE LOW SIDE FET 208 AND THE PAD GROUND 402

806 — WHEN $V_{TERM}$ EXCEEDS $V_{TRIGGER1}$, THE SWITCH 516 IS OPENED, SO THAT THE GATE OF M2N 520 IS WEAKLY PULLED UP BY THE DRIVER VOLTAGE SOURCE 506 VIA THE FIRST RESISTOR 512 AND COUPLED TO GROUND VIA THE CAPACITOR 518

808 — WHEN $V_{TERM}$ EXCEEDS $V_{TRIGGER2}$, M6N 532 TURNS ON, PROVIDING A SIGNAL PATH BETWEEN THE GATE OF M3N 522 AND THE PAD GROUND 402, TURNING OFF M3N 522

FIG. 8

NOISE-LOWERING POWER FET DRIVER

TECHNICAL FIELD

This application relates generally to power field-effect transistors (FETS), and more particularly to driving turn off of power FETS.

BACKGROUND

A power FET is a semiconductor device designed to switch on and off, and to conduct current at a wide range of power levels, such as from a few hundred milliWatts to thousands of Watts. In some examples, a power FET is used as a switch in an H-bridge circuit, connecting and disconnecting an inductive load, such as a motor, to and from a main power source or a ground. A level and direction of a current used to drive the gate of the power FET controls whether the power FET is turned on or off. The level of the current used to drive the gate of the power FET also affects characteristics of a turn-on/off process of the power FET.

SUMMARY

In described examples, an integrated circuit includes first and second transistors, a switch, a capacitor, a resistor, and first and second comparators. A first terminal of the switch is coupled to a first terminal of the resistor. A second terminal of the switch is coupled to a second terminal of the resistor, a first terminal of the capacitor, and a gate of the first transistor. The first comparator is configured to receive at the first input a first reference voltage, and an output of the first comparator is coupled to a gate of the second transistor. The second comparator is configured to receive the first input a second reference voltage. A second input of the second comparator is coupled to a second input of the first comparator. An output of the second comparator is coupled to a control input of the switch.

BRIEF DESCRIPTION OF THE DRAWINGS

FIG. 8 is a process for turning off the low side FET using the load driving circuit of FIG. 5.

DETAILED DESCRIPTION

Figure 1:
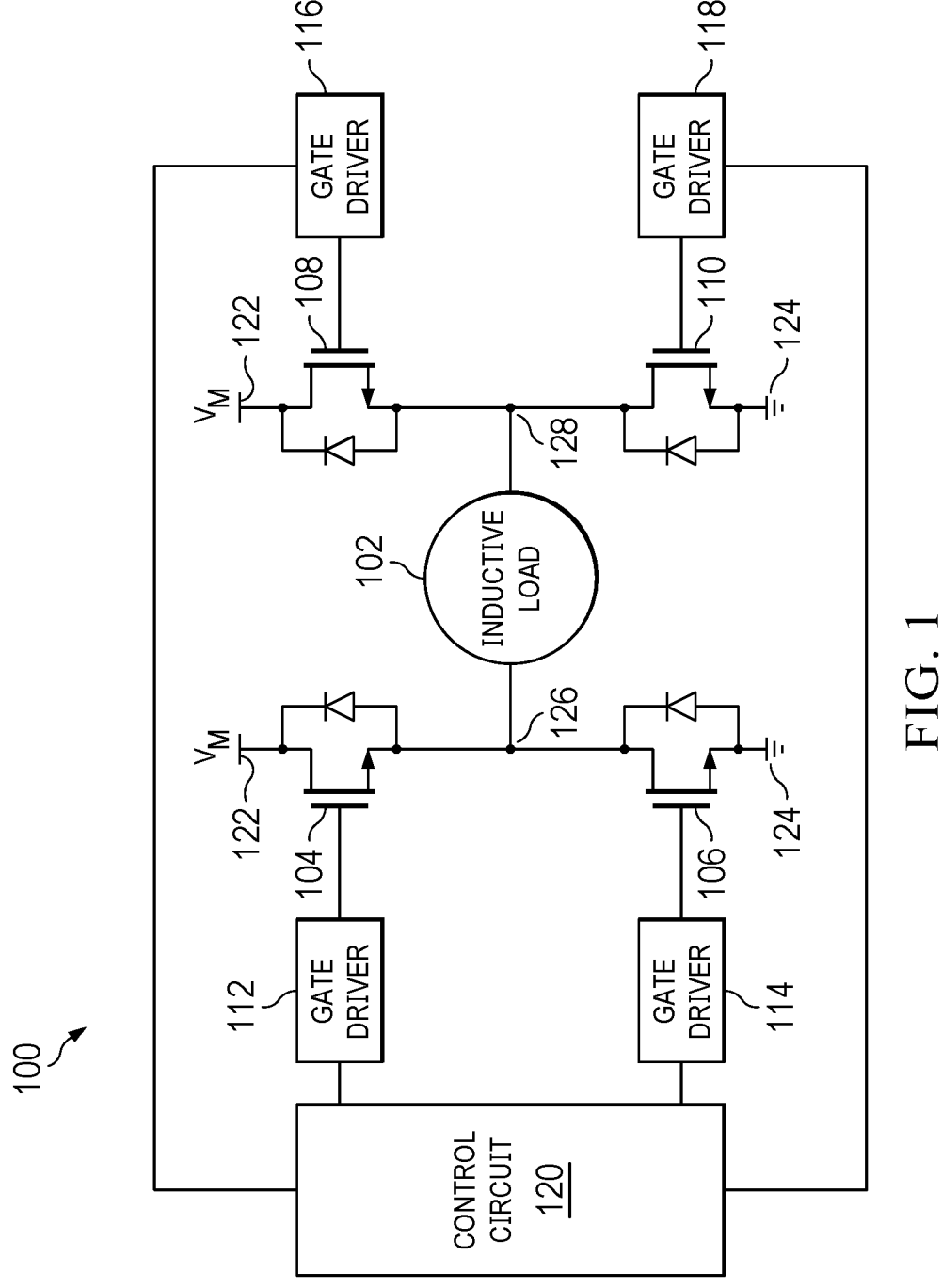
FIG. 1 is a functional block and circuit diagram of an example H-bridge circuit with an inductive load.

In some examples, in an H-bridge circuit 100 (see FIG. 1), two pairs of high side/low side power FETS (104 and 106, and 108 and 110) are disposed so that each pair brackets a different terminal of a conductive path of an inductive load 102. In some examples, the H-bridge circuit 100 is controlled using a relatively high switching frequency, such as 200 kiloHertz, and is connected to ground 124 via an inductive path such as a wire bond to a ground pad on a printed circuit board (PCB).

In such examples, during a turn off process of a low side power FET (106 or 110), a ground voltage may shift in a negative direction because the inductance of the ground connection resists a change in current as the drain-source current ($I_{DS(LS)}$) of the low side power FET (106 or 110) decreases. The negative ground voltage can increase a gate-source voltage ($V_{GS}$) of a transistor (M1N 412, see FIG. 4A) that provides a signal path between the gate of the low side power FET (106 or 110) and ground 124 so that the gate of the low side power FET (106 or 110) is pulled down to ground. This turns on the pull-down transistor (M1N 412) more, which more strongly pulls the gate of the low side power FET (106 or 110) down to ground 402, increasing the rate of change of $I_{DS(LS)}$, making the ground voltage more negative, further increasing the $V_{GS}$ of the pull-down transistor (M1N 412). In some examples, this feedback loop (also referred to as a ground bounce effect) causes functionally significant changes and ringing in supply voltages and other signal levels, potentially reducing reliability or damaging components.

In some examples, this feedback loop can be mitigated or avoided using a pull-down transistor (M2N 520, see FIG. 5) with a gate that is weakly pulled up by a voltage source 506, and is capacitively coupled to ground 402 via a capacitor 518. This allows the gate voltage of the pull-down transistor (M2N 520) to shift with the shifting ground, so that the $V_{GS}$ of the pull-down transistor (M2N 520) remains constant. In some examples, a turn-off process of the low side FET (106 or 110) includes three phases. In a first phase, one or more transistors (M2N 520 and M3N 522) with gates strongly pulled up to the voltage source 506 provide a signal path between the gate of the low side FET (106 or 110) and ground 402. In a second phase, a connection between the gate of a first one of the transistors (M2N 520) and the voltage source 506 is changed, so that the gate of the first transistor is weakly pulled up to the voltage source 506 and capacitively coupled to ground 402. In a third phase, the other transistor (M3N 522) is turned off, so that the first transistor provides a weakened signal path between the gate of the low side FET (106 or 110) and ground 402. This three phase process can be used to improve reliability.

FIG. 1 is a functional block and circuit diagram of an example H-bridge circuit 100 with an inductive load 102. The H-bridge circuit 100 also includes a first high side n-channel power FET 104 (first high side FET 104), a first low side n-channel power FET 106 (first low side FET 106), a second high side n-channel power FET 108 (second high side FET 108), a second low side n-channel power FET 110 (second low side FET 110), a first gate driver 112, a second gate driver 114, a third gate driver 116, a fourth gate driver 118, a control circuit 120, a load voltage source 122 providing a voltage $V_M$ (e.g., the voltage for driving the inductive load 102, such as a motor), and a ground 124. The first and second high side FETS 104 and 108 and the first and second low side FETS 106 and 110 are shown with their respective body diodes. A high side FET is coupled between a voltage supply and a load, and a low side FET is coupled between a ground and the load.

Drains of the first and second high side FETS 104 and 108 are connected to the load voltage source 122. A source of the first high side FET 104 is connected to a first terminal 126 of the inductive load 102 and a drain of the first low side FET 106. A source of the second high side FET 108 is connected to a second terminal 128 of the inductive load and a drain of the second low side FET 110. Sources of the first and second low side FETS 106 and 110 are connected to ground 124.

A gate of the first high side FET 104 is connected to the first gate driver 112. A gate of the first low side FET 106 is connected to the second gate driver 114. A gate of the second high side FET 108 is connected to the third gate driver 116. A gate of the second low side FET 110 is connected to the fourth gate driver 118. The control circuit 120 is connected to, and controls, the first, second, third, and fourth gate drivers 112, 114, 116, and 118.

The operation of the H-bridge circuit 100 is controlled by the closed (on) or open (off) states (activation states) of the first and second high side FETS 104 and 108 and the first and second low side FETS 106 and 110. In a first phase, the first high side FET 104 and the second low side FET 110 are closed, and the second high side FET 108 and the first low side FET 106 are open. This causes current from the first terminal 126 of the inductive load 102 to the second terminal 128 of the inductive load 102 to increase, causing the inductive load 102 to store energy by generating a magnetic field oriented in a first direction. During the first phase, current flows in a path that includes the load voltage source 122, the first high side FET 104, the inductive load 102, the second low side FET 110, and ground 124.

The first phase is followed by a first dead time, during which the first and second high side FETS 104 and 108 and the first and second low side FETS 106 and 110 are open. The dead time is used to avoid providing current to a direct, shorted path from the load voltage source 102 to ground 124 (also referred to as shoot through). Shoot through can be caused by closing the first low side FET 106 before the first high side FET 104 opens, or closing the second high side FET 108 before the second low side FET 110 opens. The shorted current path could cause large amounts of current to pass through shorted components, potentially damaging them and other components of the H-bridge circuit 100. During the dead times between phases adding energy to the inductive load 102, the inductive load 102 is a current source because the inductance resists a sudden change in current due to its stored magnetic energy. During the first dead time, the energy stored in the magnetic field of the inductive load 102 supports current flow from ground 124, via the body diode of the first low side FET 106, through the inductive load 102, via the body diode of the second high side FET 108, to the load voltage source 122.

In a second phase, the second high side FET 108 and the first low side FET 106 are closed and the first high side FET 104 and the second low side FET 110 are open. This causes current from the second terminal 128 of the inductive load 102 to the first terminal 126 of the inductive load 102 to increase, causing the inductive load 102 to store energy by generating a magnetic field oriented in a second direction that is opposite the first direction. During the second phase, current flows in a path that includes the load voltage source 122, the second high side FET 108, the inductive load 102, the first low side FET 106, and ground 124.

The second phase is followed by a second dead time, during which the first and second high side FETS 104 and 108 and the first and second low side FETS 106 and 110 are open. During the second dead time, the energy stored in the magnetic field of the inductive load 102 supports current flow from ground 124, via the body diode of the second low side FET 110, through the inductive load 102, via the body diode of the first high side FET 104, to the load voltage source 122.

Figure 2A:
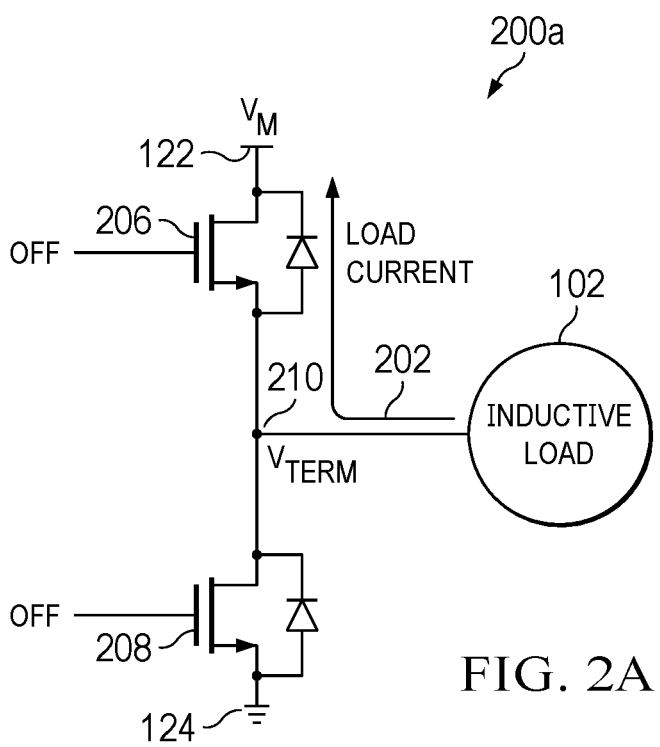
FIG. 2A is a functional block and circuit diagram of an example portion of the H-bridge circuit of FIG. 1, illustrating a first example current flow.
Figure 2B:
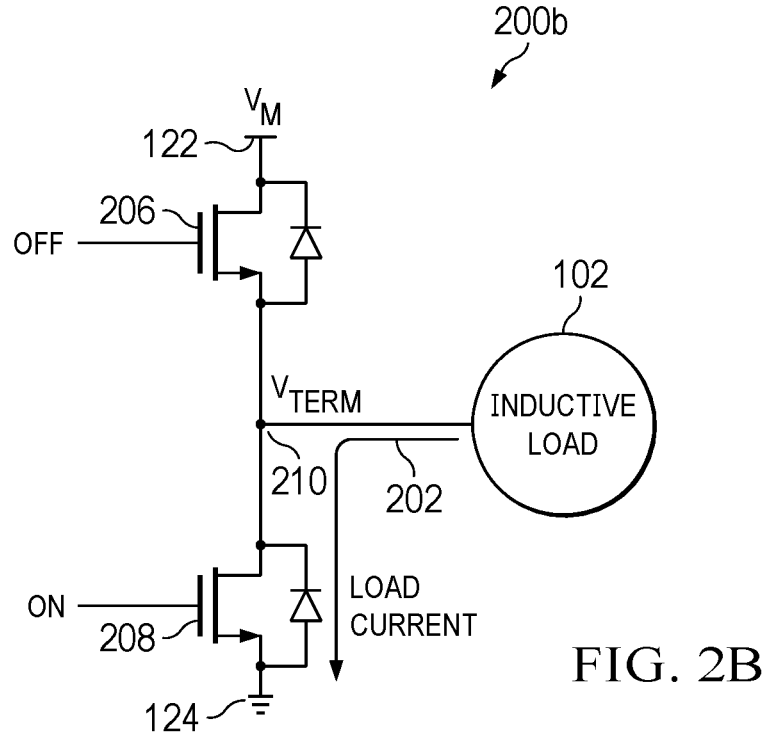
FIG. 2B is a functional block and circuit diagram of the portion of the H-bridge circuit of FIG. 1, illustrating a second example current flow.

FIG. 2A is a functional block and circuit diagram of an example portion 200a of the H-bridge circuit 100 of FIG. 1, illustrating a first example current flow 202. FIG. 2B is a functional block and circuit diagram of the portion 200b of the H-bridge circuit 100 of FIG. 1, illustrating a second example current flow 204. The portion 200a shown in FIG. 2A and the portion 200b shown in FIG. 2B illustrate the same circuit (the portion 200) but different signals. The same reference numbers or other reference designators are used in the drawings to designate the same or similar (structurally and/or functionally) features.

The portion 200 includes the first high side and low side FETS 104 and 106, or the second high side and low side FETS 108 and 110. The illustrated high side FET 104 or 108 is referred to as a high side FET 206, and the illustrated low side FET 106 or 110 is referred to as a low side FET 208. The portion 200 includes a terminal 210 of the inductive load 102. A voltage at the terminal 210 is $V_{TERM}$.

In the portion 200a of FIG. 2A, the high side and low side FETS 206 and 208 are turned off (open). The portion 200a corresponds to a dead time during which a load current 202 flows from the inductive load 102, through the terminal 210 and the body diode of the high side FET 206, to the load voltage source 122. In the portion 200b of FIG. 2B, the high side FET 206 is turned off and the low side FET 208 is turned on (closed). The portion 200b corresponds to a phase of operation of the H-bridge circuit 100 (the first phase or the second phase) during which a load current 202 flows from the inductive load 102, through the terminal 210 and the low side FET 208, to ground 124.

Figure 3A:
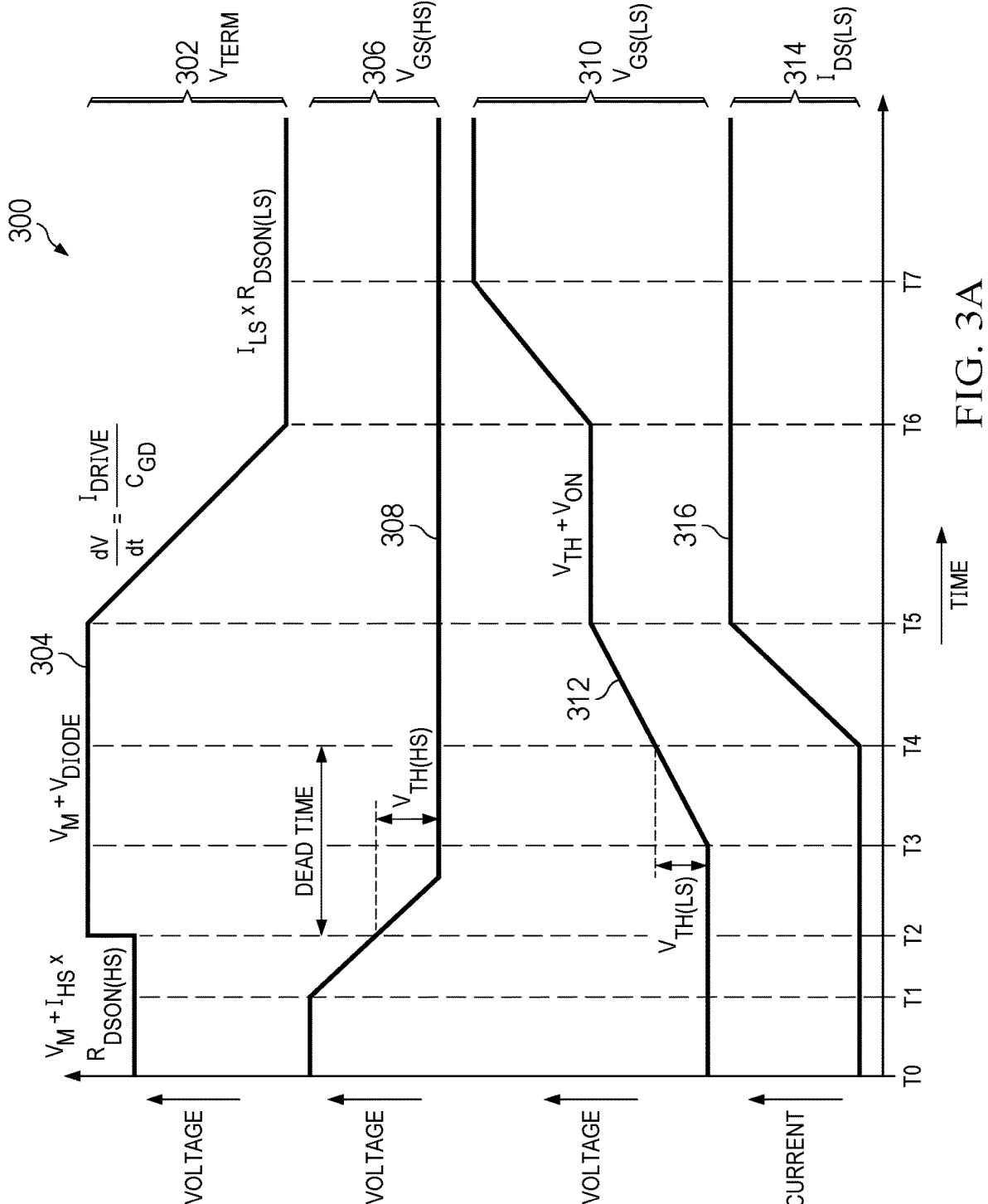
FIG. 3A is a set of graphs of example signals in the portion of the H-bridge circuit of FIGS. 2A and 2B, describing a transition from the first current flow to the second current flow.

FIG. 3A is a set of graphs 300 of example signals in the portion 200a and 200b of the H-bridge circuit 100 of FIGS. 2A and 2B, describing a transition from the first current flow 202 to the second current flow 204. The horizontal axis represents time in each of the graphs 300. A first graph 302 shows $V_{TERM}$ 304, a second graph 306 shows a gate-source voltage ($V_{GS(HS)}$) 308 of the high side FET 206, and a third graph 310 shows a gate-source voltage ($V_{GS(LS)}$) 312 of the low side FET 208. The vertical axis represents voltage in each of the first, second, and third graphs 302, 306, and 310. A fourth graph 314 shows a drain-source current ($I_{DS(LS)}$) 316 of the low side FET 208, which corresponds to a current from the terminal 210 to ground 124.

At time T0, $V_{GS(HS)}$ 308 is high, so that the high side FET 206 is turned on. $V_{TERM}$ 304 equals $V_M$ plus a current ($I_{DS(HS)}$) through the high side FET 206 multiplied by a drain-source on resistance ($R_{DSON(HS)}$) of the high side FET 5                                                                                                    6

206. (Note that while current flows from the terminal 210 to the load voltage source 122, there is a voltage drop across the body diode of the high side FET 206 in the same direction.) The low side FET 208 is off, and its body diode is oriented to prevent current from flowing from the inductive load 102 through the low side FET 208 while the low side FET 208 is off.

At time T1, $V_{GS(HS)}$ 308 starts to fall. At time T2, $V_{GS(HS)}$ 308 falls below a threshold voltage ($V_{TH(HS)}$) of the high side FET 206, so that the high side FET 206 turns off. This begins a dead time that lasts from T2 to T4. As described above, during the dead time, current continues to flow from the inductive load 102 through the body diode of the other high side FET (on the opposite side of the inductive load 102 from the high side FET 206).

At time T3, $V_{GS(LS)}$ 312 starts to increase. At time T4, $V_{GS(LS)}$ 312 rises above a threshold voltage ($V_{TH(LS)}$) of the low side FET 208, so that the low side FET 208 turns on and $I_{DS(LS)}$ 316 starts to increase. After $V_{GS}$ of the low side FET 208 reaches its $V_{TH}$, the low side FET 208 turns on in two phases, a first phase starting at T4 and a second phase starting at T5. First, from T4 to T5, the drain-source current of the low side FET 208 increases in a dI/dt phase. Also at T4, as described above, the dead time ends, after which the first phase or the second phase begins.

Second, from T5 to T6, a drain-source voltage of the low side FET 208 decreases in a dV/dt phase. The decreasing drain-source voltage of the low side FET 208 is caused by a drive current ($I_{DRIVE}$) to the gate of the low side FET 208 charging a gate-drain capacitance ($C_{GD}$) of the low side FET 208. Meanwhile, $V_{GS(LS)}$ 312 is maintained at a voltage $V_{TH(LS)}$ plus an additional turn-on voltage $V_{ON}$ while $C_{GD}$ charges. The rate of change of the drain-source voltage of the low side FET 208 during the dV/dt phase is given by Equation 1:

$$\frac{dV}{dt} = \frac{I_{DRIVE}}{C_{GD}} \qquad \text{Equation 1}$$

From T6 on, $V_{TERM}$ 304 equals $I_{LS} \times R_{DSON(LS)}$. At T6, the gate driver 114 or 118 exits a constant current mode and transitions to a resistive pull-up mode to maintain the low side FET 208 in the on state, so that $V_{GS(LS)}$ increases from T6 to T7. Following T7, the H-bridge circuit 100 continues to operate in the first phase or the second phase, corresponding to the low side FET 208 being turned on.

Figure 3B:
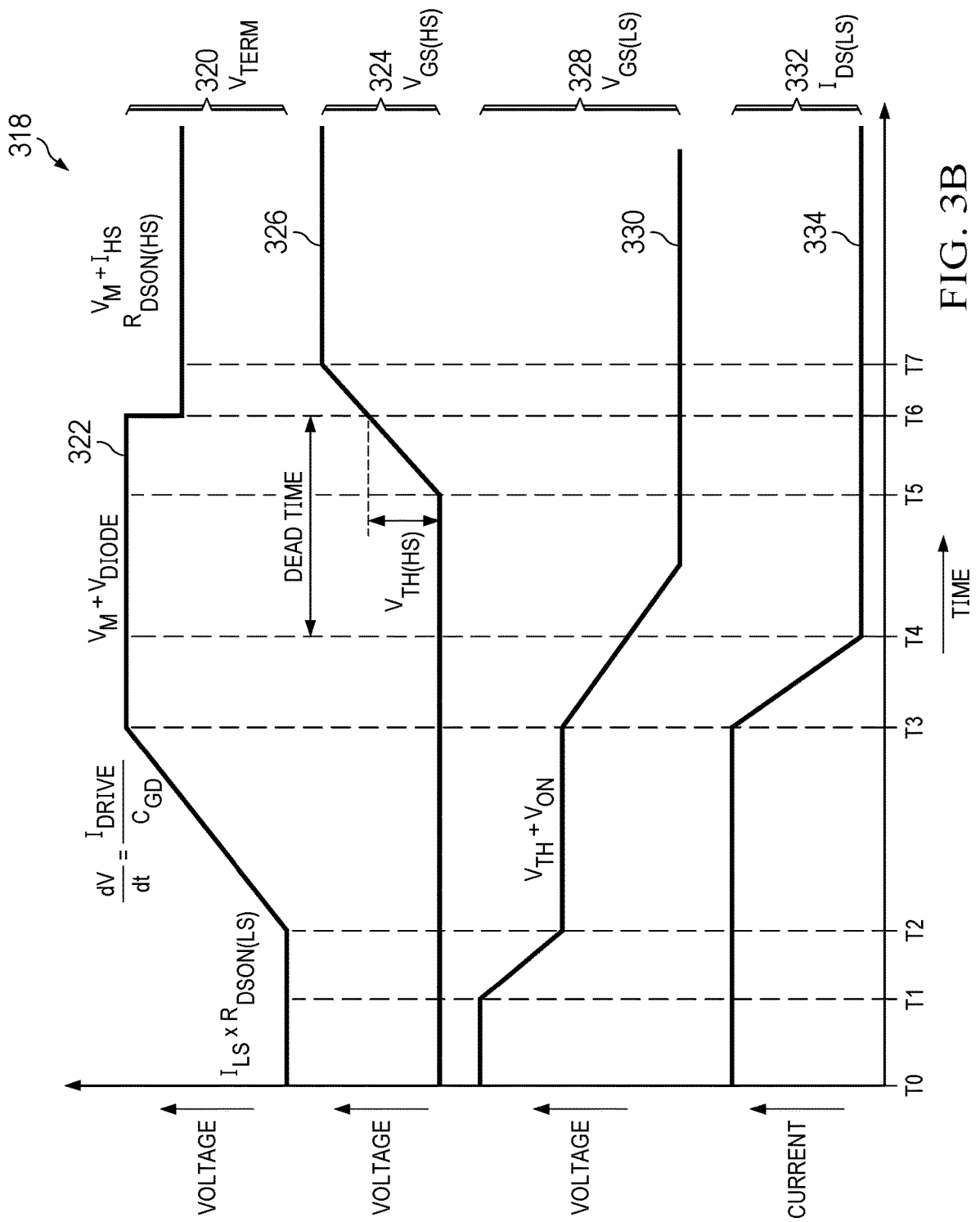
FIG. 3B is a set of graphs of example signals in the portion of the H-bridge circuit of FIGS. 2A and 2B, describing a transition from the second current flow to the first current flow.

FIG. 3B is a set of graphs of example signals in the portion 200a and 200b of the H-bridge circuit 100 of FIGS. 2A and 2B, describing a transition from the second current flow 204 to the first current flow 202. The changes in signals shown in FIG. 3B are similar to those shown in FIG. 3A, in reverse time order. At T0, the H-bridge circuit 100 is operating in phase one or phase two, corresponding to the low side FET 208 being turned on. At T1, the low side FET 208 starts to turn off, and $V_{GS(LS)}$ 330 starts to decrease. From T2 to T3, $V_{GS(LS)}$ 330 is maintained at $V_{TH}$ plus $V_{ON}$ during the dV/dt phase, as $V_{DS(LS)}$—and, accordingly, $V_{TERM}$ 322—increase. At T3 $V_{TERM}$ reaches $V_M$ plus $V_{DIODE}$, and the dI/dt phase starts: $I_{DS(LS)}$ falls and $V_{GS(LS)}$ 330 starts to fall.

At T4, $V_{GS(LS)}$ 330 falls below $V_{TH(LS)}$, so that $I_{DS(LS)}$ reaches zero. T4 is the beginning of a dead time that lasts until T6. At T5 the high side FET 206 starts to turn on. At T6, $V_{GS(HS)}$ 326 reaches $V_{TH(HS)}$, the high side FET 206 turns on, and $V_{TERM}$ 322 drops to $V_M + I_{HS} \times R_{DSON(HS)}$. At T7, the high side FET 206 is fully turned on, and the H-bridge circuit 100 operates in phase one or phase two (whichever phase the H-bridge circuit was not in at T0).

Figure 4A:
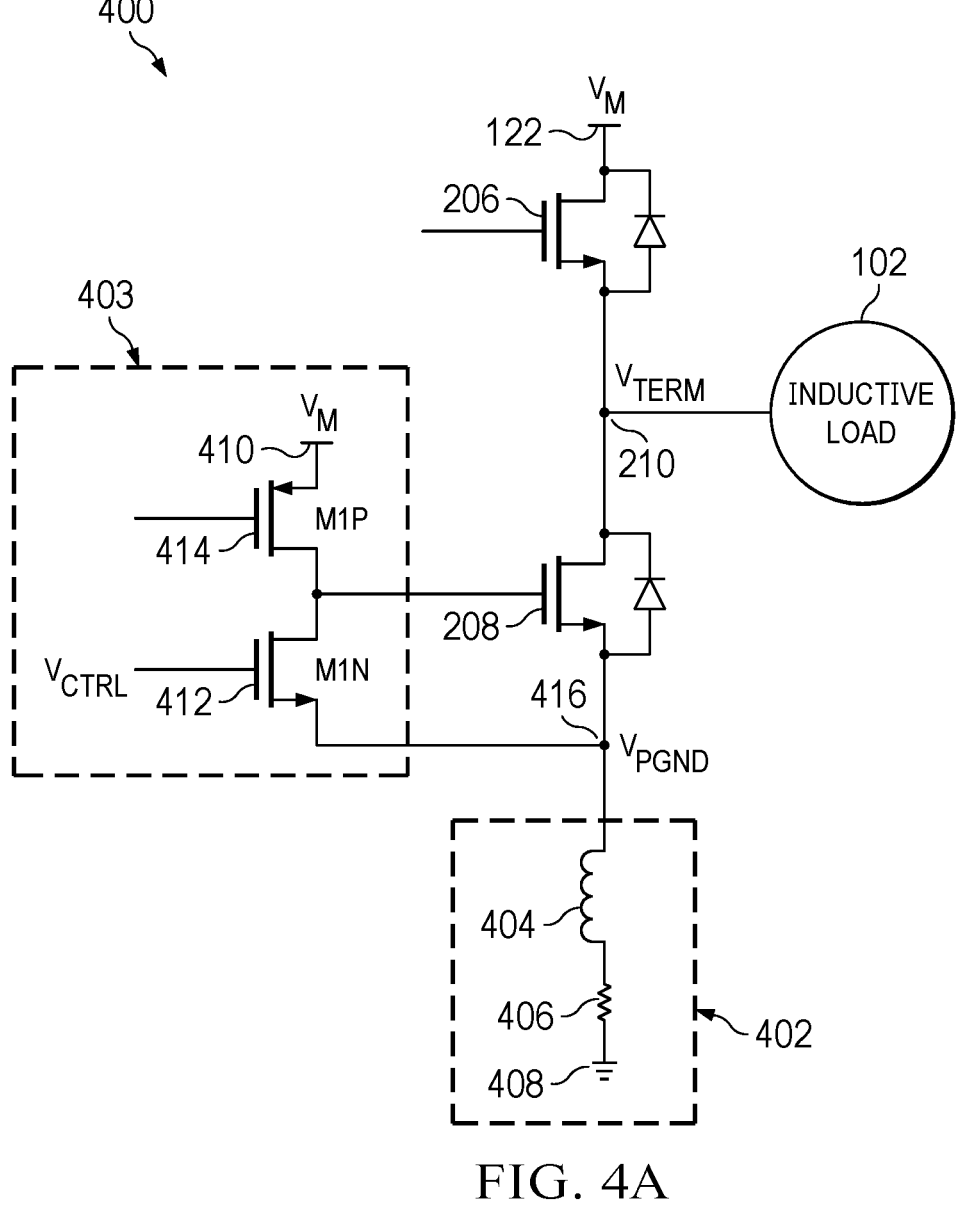
FIG. 4A is a functional block and circuit diagram of a load driving circuit that includes the portion of the H-bridge circuit of FIGS. 2A and 2B, along with a pad ground and control circuitry for the low side FET.
Figure 4B:
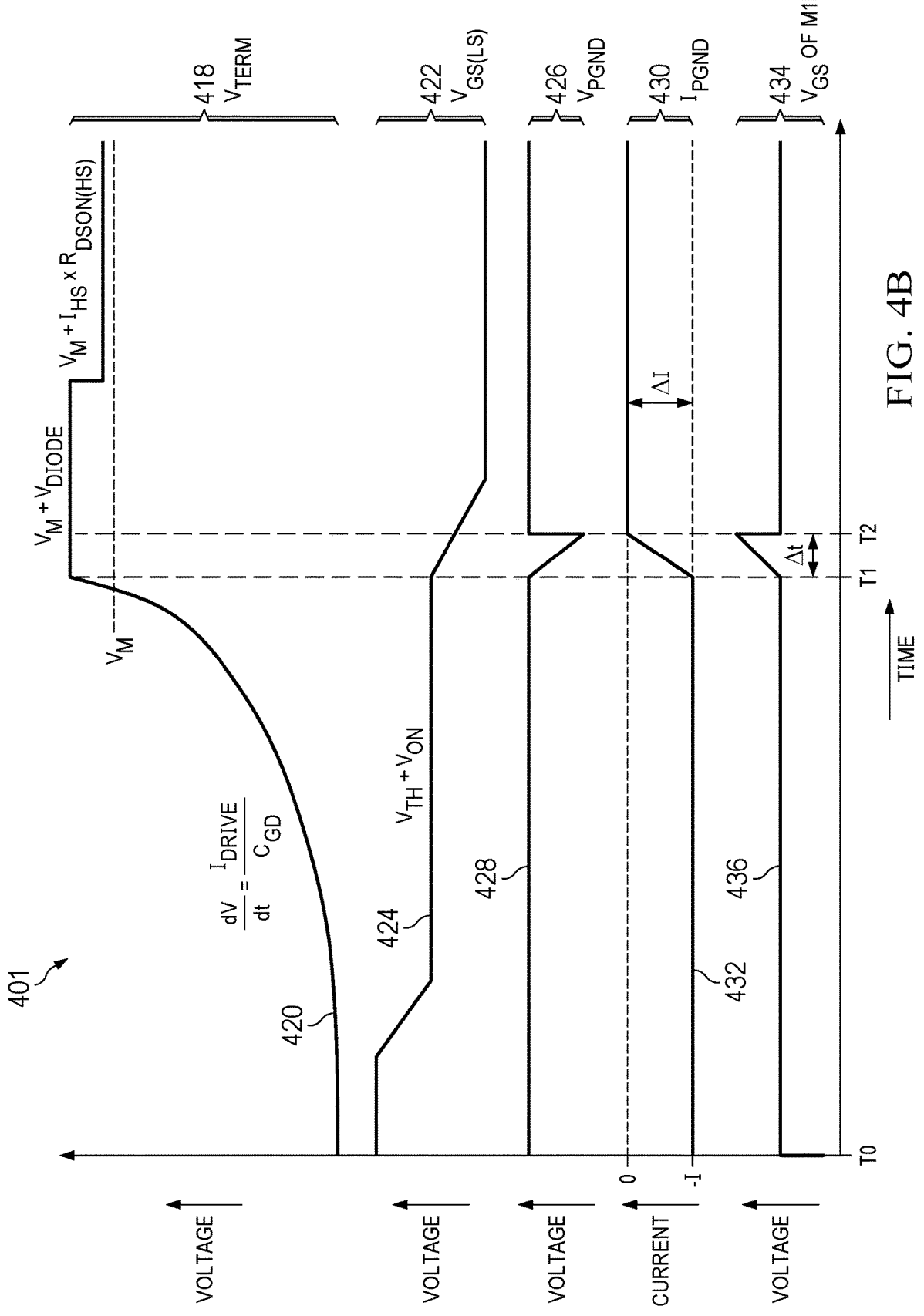
FIG. 4B is a set of graphs of example signals in the circuit of FIG. 4A, describing operation of the circuit during an example transition from the second current flow to the first current flow.

FIG. 4A is a functional block and circuit diagram of a load driving circuit 400 that includes the portion 200 of the H-bridge circuit 100 of FIGS. 2A and 2B, along with a pad ground 402 and control circuitry 403 for the low side FET 208. FIG. 4B is a set of graphs 401 of example signals in the load driving circuit 400 of FIG. 4A, describing operation of the load driving circuit 400 during an example transition from the second current flow 204 to the first current flow 202. In other words, the graphs 401 of FIG. 4B correspond to the low side FET 208 turning off. MOSFETS are numbered as M[number][channel type], where the number increases corresponding to the channel type.

Referring to FIG. 4A, the pad ground 402 includes an inductance 404 represented as an inductor, a resistance 406 represented as a resistor, and a ground 408. The pad ground 402 includes, for example, a bond wire that connects a ground connector of an IC or other device on which the H-bridge circuit 100 is fabricated to a pad, other printed circuit board connection, or other physical connection of a mounting system that is electrically connected to ground 408. Accordingly, the pad ground 402 is also referred to as a ground connection, as it represents the physical connections/couplings between one or more circuit components and electrical ground, the physical connections/couplings having electrical characteristics such as an inductance and a resistance. A ground connection having at least an inductance may be referred to as an inductive connection. A ground connection having at least a resistance may be referred to as a resistive connection. A ground connection having an inductance and a resistance may be referred to as an inductive and/or resistive connection. The inductance 404 has inductance $L_{BW}$, corresponding to the inductance of the bond wire. The control circuitry 403 includes a control voltage source 410, a first n-channel metal-oxide-semiconductor FET (MOSFET) (M1N) 412, and a first p-channel MOSFET (M1P) 414.

Ground 408 is connected to a first terminal of the resistance 406. A second terminal of the resistance 406 is connected to a first terminal of the inductance 404. A second terminal of the inductance 404 is connected to the source of the low side FET 208 and a source of the M1N 412. A pad ground node 416 is located between the source of the low side FET 208 and the pad ground 402. In some examples, the pad ground node 416 corresponds to a physical terminal, such as a pin or pad, of an integrated circuit (IC) that includes some or all of the pull-down circuit 502, the voltage trigger circuit 504, and/or the low side FET 208. The pad ground node 416 has voltage $V_{PGND}$, which is the voltage from the pad ground node 416 to ground 408. Note that $V_{TERM}$ equals a drain-source voltage $V_{DS(LS)}$ of the low side FET 208 plus $V_{PGND}$.

A drain of M1N 412 is connected to a drain of M1P 414 and a gate of the low side FET 208. A source of M1P 414 is connected to the control voltage source 410. The gate of M1N 412 receives a control voltage $V_{CTRL}$. The gate of M1P 414 also receives a control voltage (not shown).

If the dV/dt curve of $V_{DS(LS)}$ as the low side FET 208 turns off is too steep, the dI/dt curve of $I_{DS(LS)}$ will be too steeply negative. This corresponds to current switching from the second current path to the first current path so quickly as to cause the $V_{GS}$ of M1N 412 and other components to exceed design parameters, and potentially cause other device malfunction. Note that the $I_{DS(LS)}$ curve (not shown) is the same as the $I_{PGND}$ curve, but with opposite polarity (this is also true with respect to FIGS. 6 and 7).

Too-rapid switchover of current paths causes a negative change in $V_{PGND}$ as a result of rapid change in current through the inductance 404 of the pad ground 402. As shown in Equation 2, the drop in $V_{PGND}$ below the nominal low voltage reference at the pad ground node 416 is proportional to the inductance $L_{BW}$ of the inductance 404 and the (negative) dI/dt of $I_{DS(LS)}$. Equation 3 gives the $V_{GS}$ of M1N 412.

$$\Delta V_{PGND} = L_{BW} \times \frac{dI}{dt} \qquad \text{Equation 2}$$

$$V_{GS} = V_{CTRL1} - V_{PGND} \qquad \text{Equation 3}$$

Equation 3 shows that $V_{PGND}$ dropping below the nominal low voltage reference level increases the $V_{GS}$ of M1N 412 above the intended level. This creates a potentially destructive feedback loop: the $V_{GS}$ of M1N 412 increasing turns on M1N 412 more than intended, which more strongly pulls the gate of the low side FET 208 to ground 124. This pulls the voltage of the gate of the low side FET 208 down harder, and discharges the $C_{GD}$ of the low side FET 208 more quickly. In other words, the low side FET 208 turns off more quickly. The low side FET 208 turning off faster makes the dI/dt of the low side FET 208 more negative, which causes $V_{PGND}$ to decrease further (Equation 2), which increases the $V_{GS}$ of M1N 412 even more (Equation 3).

Negative $V_{PGND}$ may lead to ringing in the $V_{PGND}$ low voltage reference signal, as well as in other voltage supplies and other signals of the H-bridge circuit 100, including $V_{TERM}$. Supply voltage swings and ringing in H-bridge circuit 100 signals can interfere with signal measurement and other circuit function, affecting reliability and performance. In some examples, it is necessary to suspend measurement of H-bridge circuit 100 and other device signals during ringing to maintain reliable sampling. In some examples, this sets a lower bound on a pulse width modulation duty cycle, and/or can lead to coil current runaway.

Referring to FIG. 4B, the graphs 401 include a first graph 418 showing $V_{TERM}$ 420, a second graph 422 showing $V_{GS(LS)}$ 424 (gate-source voltage of the low side FET 208), a third graph 426 showing $V_{PGND}$ 428, a fourth graph 430 showing a current ($I_{PGND}$) 432 through the inductance 404 of the pad ground 402, and a fifth graph 434 showing a $V_{GS}$ 436 of M1N 412. The horizontal axis represents time. The vertical axis of the first, second, third, and fifth graphs 418, 422, 426, and 434 represents voltage. The vertical axis of the fourth graph 430 represents current.

At time T0, M1N 412 is turned on, so that the $V_{GS}$ 436 of M1N 412 goes from an off voltage to an on voltage. $I_{PGND}$ is initially −I (negative I) and $I_{DS(LS)}$ (not shown) is I, where I is a current level and current is positive when entering the pad ground 402 and negative when leaving the pad ground 402. Turn off of the low side FET 208 proceeds as described with respect to FIG. 2B until $V_{TERM}$ 420 approaches $V_M$ (load supply voltage 122). This occurs shortly before T1, when low side FET 208 turn off completes the dV/dt phase and begins the dI/dt phase.

As the dV/dt phase approaches its conclusion, $C_{GD}$ of the low side FET 208 becomes relatively small, so that dV/dt becomes relatively large (see Equation 1). At T1, the dV/dt phase ends and the dI/dt phase begins. The $V_{GS(LS)}$ 424 of the low side FET 208 starts to decrease, so that $I_{PGND}$ 432 starts to increase from −1 towards zero; accordingly, $I_{DS(LS)}$ starts to decrease from I towards zero. A relatively large dV/dt causes dI/dt to have a relatively large magnitude, which causes a rapid change in current through the inductance 404 of the pad ground 402. As described above with respect to FIG. 4A and Equations 2 and 3, this causes $V_{PGND}$ 428 to become more negative and the $V_{GS}$ 436 of M1N 412 to become more positive in a mutually-reinforcing feedback loop. This feedback loop can potentially damage circuit function and components.

At T2, the dI/dt phase ends, and the $V_{GS}$ of the low side FET 208 falls below its $V_{TH}$. Also, $I_{PGND}$ 432 reaches zero. The total change in $I_{DS(LS)}$ during dI/dt is approximately constant. This means that adjusting the time from T1 to T2, $\Delta t$, which is the duration of the dI/dt phase, will adjust the magnitude of dI/dt in linear proportion.

Figure 5:
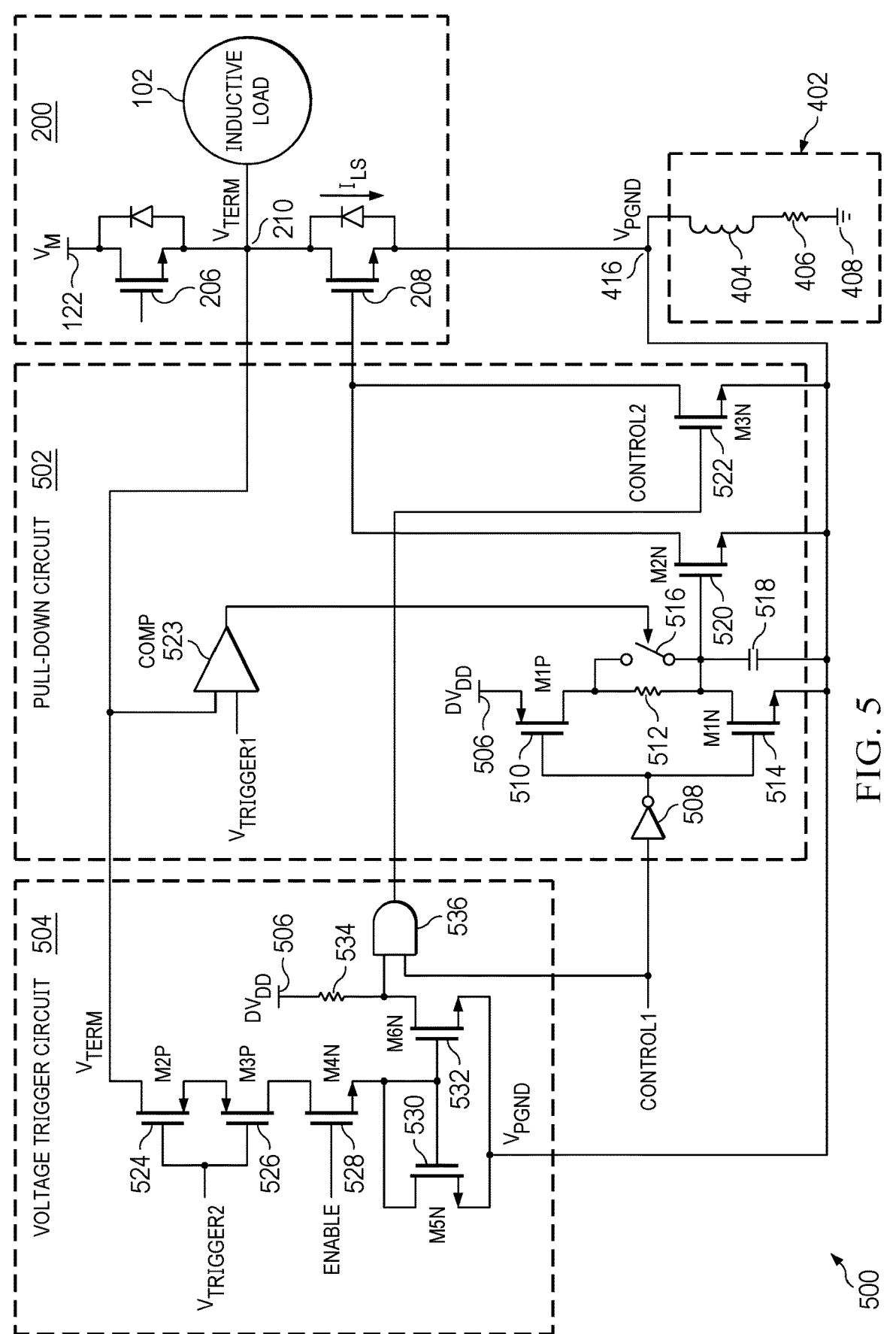
FIG. 5 is a functional block and circuit diagram of a load driving circuit including the portion of the H-bridge circuit of FIGS. 2A and 2B, with an example pull-down circuit and an example voltage trigger circuit.

FIG. 5 is a functional block and circuit diagram of a load driving circuit 500 including the portion 200 of the H-bridge 100 of FIGS. 2A and 2B, with an example pull-down circuit 502 and an example voltage trigger circuit 504. The load driving circuit 500 of FIG. 5 enables a turn off process of the low side FET 208 to mitigate or avoid the potentially destructive gate driver pull-down/negative ground voltage feedback loop described with respect to FIGS. 4A and 4B. It does this by providing a signal path from a driver voltage source 506, via a relatively high resistance first resistor 512, to weakly pull-up the gate of a transistor (M2N 520, see below); and by capacitively coupling the gate of M2N 520 to the pad ground 402. As a result, when $V_{PGND}$ drops, the gate voltage of M2N 520 does, too, so that the $V_{GS}$ of M2N 520 remains at or near a designed value. M2N 520 provides a signal path between the gate of the low side FET 208 and ground. Accordingly, the adverse feedback loop described with respect to FIGS. 4A and 4B is mitigated or avoided.

The pull-down circuit 502 includes the driver voltage source 506 that provides a voltage $DV_{DD}$, an inverter 508, a first p-channel MOSFET (M1P) 510, the first resistor 512, a first n-channel MOSFET (M1N) 514, a switch 516, a capacitor 518, a second n-channel MOSFET (M2N) 520, a third n-channel MOSFET (M3N) 522, and a comparator 523. The voltage trigger circuit 504 includes a second p-channel MOSFET (M2P) 524, a third p-channel MOSFET (M3P) 526, a fourth n-channel MOSFET (M4N) 528, a fifth n-channel MOSFET (M5N) 530, a sixth n-channel MOSFET (M6N) 532, a second resistor 534, an AND gate 536, and connections to the driver voltage source 506 and the pad ground 402. The voltage trigger circuit 504 can also be considered a voltage sensor or comparator.

The inverter 508 has an input and the AND gate 536 has a first input that each receive a first control signal CONTROL1 having a voltage $V_{CTRL1}$. CONTROL1 controls whether M2N 520 is turned on or turned off; and, along with the voltage trigger circuit 504, controls whether M3N 522 is turned on or turned off. An output of the inverter 508 is connected to a gate of M1P 510 and a gate of M1N 514. A source of M1P 510 is connected to the driver voltage source 506, and a drain of M1P 510 is connected to a first terminal of the first resistor 512 and a first terminal of the switch 516. A drain of M1N 514 is connected to a second terminal of the first resistor 512, a second terminal of the switch 516, a first terminal (such as a plate) of the capacitor 518, and a gate of M2N 520.

M1P 510 and M1N 514 together operate or function as an inverter of the output of the inverter 508, and may thus be referred to as an inverter circuit or an inverter. This means that together M1P 510 and M1N 514 provide to the gate of M2N 520 a voltage corresponding to a logical inversion (high voltage for low, low voltage for high) of the output of the inverter 508.

A first input of the comparator 523 is connected to a drain of M2P 524, the drain of the low side FET 208, the source of the high side FET 206, and the terminal 210 of the inductive load 102. A second input of the comparator 523 receives a first trigger voltage $V_{TRIGGER1}$. The output of the comparator 523 is connected to a control input of the switch 516.

A drain of M2N 520 is connected to a drain of M3N 522 and the gate of the low side FET 208. The pad ground node 416 is connected to a source of M1N 514, a second terminal of the capacitor 518, a source of M2N 520, a source of M3N 522, a source of M5N 530, a source of M6N 532, and the source of the low side FET 208.

A gate of M3N 522 is connected to an output of the AND gate 536. A second input of the AND gate 536 is connected to a first terminal of the second resistor 534 and a drain of M6N 532. A voltage signal received by the gate of M3N 522 is referred to as CONTROL2, which provides a voltage $V_{CTRL2}$. CONTROL2 controls whether M3N 522 is turned on or turned off. A second terminal of the second resistor 534 is connected to the driver voltage source 506. A gate of M6N 532 is connected to a gate and a drain of M5N 530, and a source of M4N 528. Accordingly, M5N 530 and M6N 532 together form a current mirror. A gate of M4N 528 receives an ENABLE signal that activates the voltage trigger circuit 504. A drain of M4N 528 is connected to a drain of M3P 526. A source of M3P 526 is connected to a source of M2P 524. A gate of M3P 526 and a gate of M2P 524 are connected to each other, and receive a second trigger voltage $V_{TRIGGER2}$.

Figure 6:
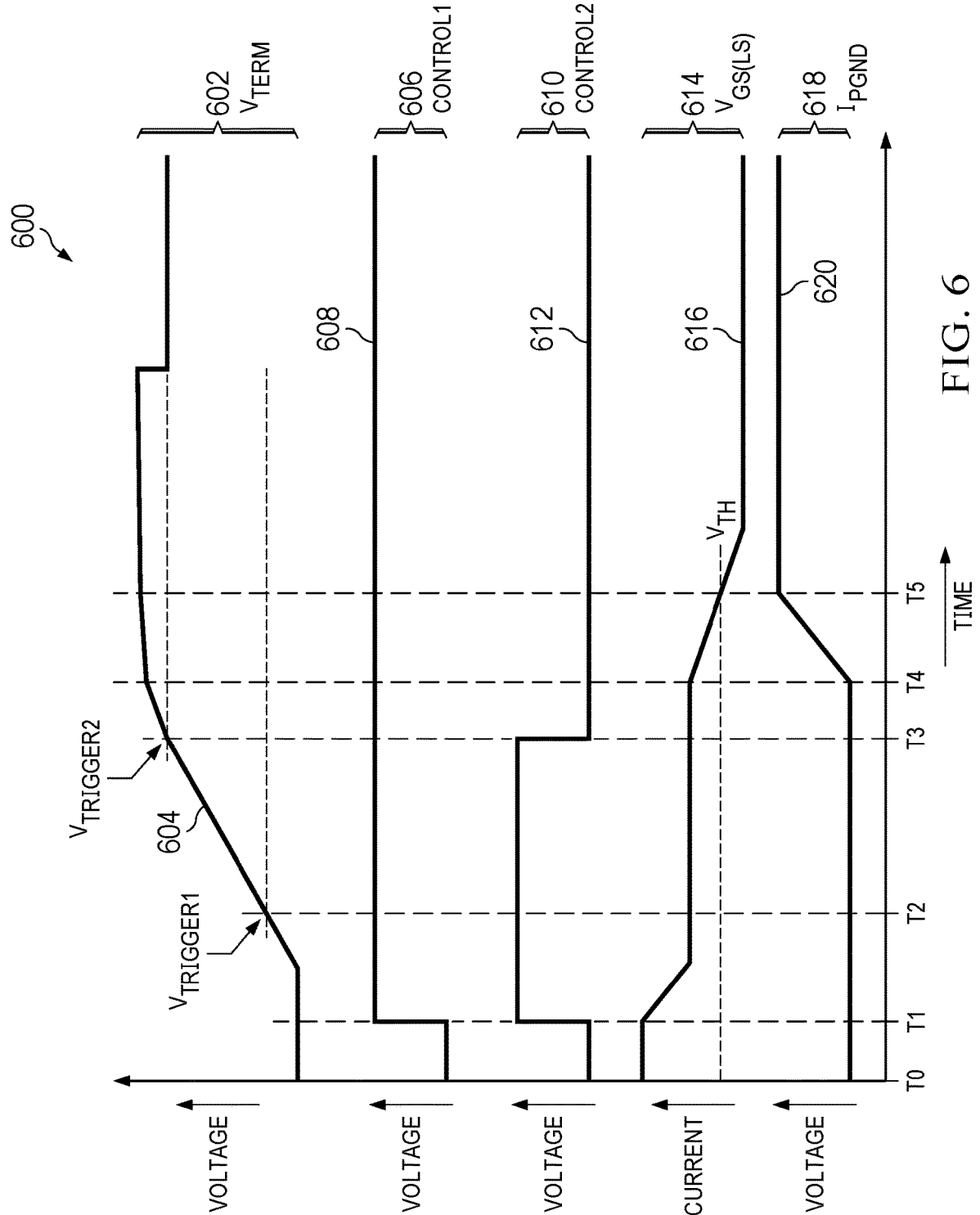
FIG. 6 is a set of graphs of example signals in the load driving circuit of FIG. 5 describing a turn off process of the low side FET.

FIG. 6 is a set of graphs 600 of example signals in the load driving circuit 500 of FIG. 5 describing a turn off process of the low side FET 208. The horizontal axis represents time. A first graph 602 shows $V_{TERM}$ 604, a second graph 606 shows CONTROL1 608, a third graph 610 shows CONTROL2 612, and a fourth graph 614 shows $V_{GS(LS)}$ 616. The vertical axes of the first, second, third, and fourth graphs 602, 606, 610, and 614 represent voltage. A fifth graph 618 shows $I_{PGND}$620. The vertical axis of the fifth graph 618 represents current.

At T0, the H-bridge 100 circuit operates in a first or second phase so that the low side FET 208 is turned on. $V_{TERM}$ 604 is less than $V_{TRIGGER1}$ (that is, $V_{TERM}$ 604 is small or zero), so that the switch 516 is closed, providing a shorted path from the driver voltage source 506 to the gate of M2N 520 once M1P 510 is turned on. At T0, CONTROL1 is low, so that M1P 510 is turned off and M1N 514 is turned on, grounding the gate of M2N 520. CONTROL1 being low causes the output of the AND gate 536, which is CONTROL2, to be a logical zero. A logical zero output of the AND gate 536 corresponds to a relatively low voltage (such as ground), and a logical one output of the AND gate 536 corresponds to a relatively high voltage (such as $DV_{DD}$). Accordingly, while CONTROL1 is low, CONTROL2 is low.

At T1, to start the turn off process of the low side FET 208, CONTROL1 goes high to turn on M1P 510. M6N 532 is turned off, so the second input of the AND gate 536 is high, pulled up by the driver source voltage 506. Accordingly, CONTROL1 being high causes the output of the AND gate 536 to be a logical one, so that that CONTROL2 goes high to turn on M3N 522. M1P 510 turning on provides a signal path between the gate of M2N 520 and the driver voltage source 506 (shorting around the first resistor 512), turning on M2N 520. Turning on M2N 520 and M3N 522 provides a signal path between the gate of the low side FET

208 and the pad ground 402, which begins discharging the gate of the low side FET 208 to turn it off. Using both M2N 520 and M3N 522 to pull down the gate of the low side FET 208 means that the gate of the low side FET 208 is strongly pulled down, so that the gate of the low side FET 208 turns off relatively quickly and $V_{TERM}$ 604 increases relatively quickly. This shortens the dV/dt phase, reducing power dissipation caused by switching losses.

At T2, when $V_{TERM}$ 604 exceeds $V_{TRIGGER1}$, the output of the comparator 523 goes low to open the switch 516. Without the shorted path provided by the switch 516, the gate of M2N 520 is pulled up by the driver voltage source 506 through the first resistor 512. In some examples, the resistance of the first resistor 512 is selected so that the gate of M2N 520 is weakly pulled up. $V_{TRIGGER1}$ is selected to be high enough to ensure that $V_{TERM}$ 604 has started to rise before the switch 516 is opened, and low enough to ensure that the switch 516 is open before the dI/dt phase of low side FET 208 turn off begins (for example, less than or equal to $V_{TRIGGER2}$). Waiting for the gate of M2N 520 to be pulled up to the driver voltage source 506 before the switch 516 is opened facilitates a relatively high dV/dt of $V_{TERM}$ 604 during the dV/dt phase, which helps to reduce power dissipation. Note that after the switch 516 is opened, the gate of M2N 520 has a weak pull-up path to the driver voltage source 506.

At T3, when $V_{TERM}$ 604 exceeds $V_{TRIGGER2}$, M2P 524 and M3P 526 turn on. This provides a bias voltage to turn on M5N 530 and M6N 532. M6N 532 turning on enables a current to flow through the second resistor 534 to the pad ground 402, and provides a signal path between the second input of the AND gate 536 and the pad ground 402. This causes the output of the AND gate 536, CONTROL2, to go low, turning off M3N 522. Turning off M3N 522 reduces the strength of the pull-down of the gate of the low side FET 208. The voltage trigger circuit 504 acts as a fast comparator, turning M3N 522 off quickly after $V_{TERM}$ 604 exceeds $V_{TRIGGER2}$. This means that the drain-source path of M2N 520 provides the signal path between the gate of the low side FET 208 and the pad ground 402.

While the gate of M2N 520 is weakly pulled up by the driver voltage source 506 via the first resistor 512, and capacitively coupled to the pad ground 402 via the capacitor 518, the gate voltage of M2N 520 changes with $V_{PGND}$. This reduces dV/dt and prevents the adverse feedback loop described above, so that, after the dI/dt phase starts at T4, the dI/dt phase last longer, dI/dt is shallower, and $V_{PGND}$ becomes less negative. $I_{PGND}$ 620 changes from −I at T4 to zero at T5. The dI/dt phase ends, and $V_{GS(LS)}$ falls below $V_{TH(LS)}$, at T5, after which operation proceeds as described above with respect to FIG. 3B.

The first resistor 512 and the capacitor 518 are sized so that their RC time constant is relatively large with respect to the time taken for $I_{PGND}$ 620 to change from −1 to zero, which is the duration of the dI/dt phase. In some examples, this RC time constant is at least ten times the duration of the dI/dt phase. Sizing the first resistor 512 and the capacitor 518 according to this constraint means that when $V_{PGND}$ goes negative (see FIG. 4B), the current drawn from the negative terminal of the capacitor 518 is much larger than a current that can be provided by the weak pull-up path from the driver voltage source 506 through the first resistor 512. This enables the $V_{GS}$ of M2N 520 to be limited to a narrow range, such as ±5%.

$V_{TRIGGER2}$ is selected so that the CONTROL2 signal will go low before the start of the dI/dt phase. $V_{TRIGGER2}$ can be selected in response to a slew rate of $V_{TERM}$ during the dV/dt phase, a response rate of the voltage trigger circuit 504, and a turn off rate of M3N 522. In some examples, if $V_{TRIGGER2}$ is set too low, M3N 522 will turn off too early in the dV/dt phase, causing dV/dt to be lower ($V_{TERM}$ to increase more slowly), leading to increased switching losses. In an example, $V_{TRIGGER2}$ is 5 Volts (V) less than $V_M$.

Figure 7:
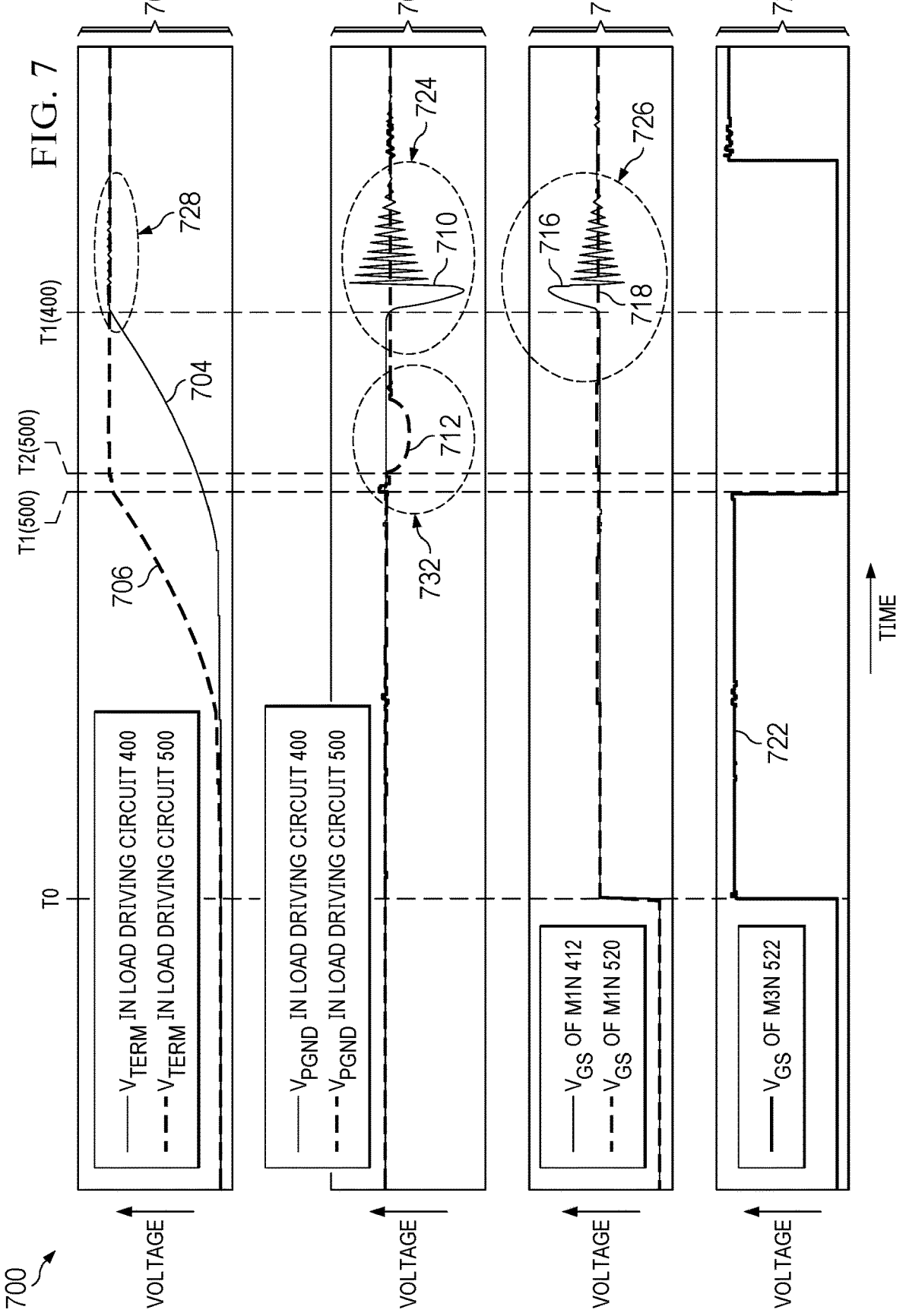
FIG. 7 is a set of graphs comparing example signals in the load driving circuit of FIG. 4A and the load driving circuit of FIG. 5 during respective turn off processes of the low side FET.

FIG. 7 is a set of graphs 700 comparing example signals in the load driving circuit 400 of FIG. 4A and the load driving circuit 500 of FIG. 5 during respective turn off processes of the low side FET 208. A horizontal axis represents time, and the each of the various vertical axes represents voltage. A first graph 702 shows $V_{TERM}$ 704 in the load driving circuit 400 and $V_{TERM}$ 706 in the load driving circuit 500. A second graph 708 shows $V_{PGND}$ 710 in the load driving circuit 400 and $V_{PGND}$ 712 in the load driving circuit 500. A third graph 714 shows the $V_{GS}$ 716 of M1N 412 and the $V_{GS}$ 718 of M2N 520. A fourth graph 720 shows the $V_{GS}$ 722 of M3N 522. After the start of the turn off process at TO, signal changes corresponding to the load driving circuit 500 of FIG. 5 are shifted earlier in time to make it easier to compare the signals for the different circuits 400 and 500.

Referring to signals corresponding to the load driving circuit 400 of FIG. 4A: at T1(400), the dV/dt phase ends, and the dI/dt phase begins. The feedback loop described above with respect to FIG. 4A and Equations 2 and 3 is reflected in a relatively large negative $V_{PGND}$ 710 event 724, as well as ringing 724 in $V_{PGND}$ 710, ringing 726 in the $V_{GS}$ of M1N 412, and ringing 728 in $V_{TERM}$ 704 (the latter is more difficult to see because the scale used in the first graph 702 is approximately a magnitude larger than for the other voltages shown in the graphs 700). In an example, $V_M$ is 65 Volts (V), an $R_{DSON}$ of the low side FET 208 is 40 milliOhms (mΩ), an output rise/fall time is 50 nanoseconds (ns), a voltage of the control voltage source 410 is 5 V, and $V_{CTRL}$ of M1N 412 when turned on is 5 V. In the example, $V_{PGND}$ 710 falls to a negative voltage of −3.9 V after T1(400), so that the $V_{GS}$ of M1N 412 rises as high as 8.9 V.

Referring to signals corresponding to the load driving circuit 500 of FIG. 5: At T1(500), CONTROL2 goes low so that M3N 522 turns off, after which the $V_{TERM}$ 706 curve becomes shallower. This shows that dV/dt of the low side FET 208 becomes smaller after M3N 522 is turned off. At T2(500), the dV/dt phase ends, and the dI/dt phase begins. Subsequently there is a relatively small negative $V_{PGND}$ 712 event 732, and relatively little or no ringing in other corresponding signals. In an example, $V_M$ is 65 V, an $R_{DSON}$ of the low side FET 208 is 40 mΩ, a time for $V_{TERM}$ 706 to rise from 0 V to $V_M$ or fall from $V_M$ to 0 V is 50 ns, $DV_{DD}$ is 5 V, and a resistance of the first resistor 512 is 1 MΩ. In the example, $V_{PGND}$ 712 falls to a negative voltage of −1 V after T2(500). Because of the capacitive coupling of the gate of M1N 520 to the pad ground 402, the $V_{GS}$ of M1N 520 rises to about 5.2 V (that is, by 0.2 V above baseline). Note that the slopes of the $V_{TERM}$ 704 curve and the $V_{TERM}$ 706 curve are approximately the same, indicating that the feedback loop is mitigated without increasing power dissipation caused by switching losses.

FIG. 8 is a process 800 for turning off the low side FET 208 using the load driving circuit 500 of FIG. 5. In process block 802, the switch 516 is closed and the control circuit 120 provides the $V_{TRIGGER1}$, $V_{TRIGGER2}$, and ENABLE signals. In process block 804, the control circuit 120 causes CONTROL1 to go high to turn on M2N 520 and M3N 522, which provides a signal path between the gate of the low side FET 208 and the pad ground 402. This begins to discharge the gate of the low side FET 208, and begins the dV/dt phase. In process block 806, when $V_{TERM}$ exceeds $V_{TRIGGER1}$, the switch 516 is opened, so that the gate of M2N 520 is weakly pulled up by the driver voltage source 506 via the first resistor 512. In process block 808, when $V_{TERM}$ exceeds $V_{TRIGGER2}$, M6N 532 turns on, providing a signal path between the gate of M3N 522 and the pad ground 402, turning off M3N 522.

In some examples, the pull-down circuit 502 and/or the voltage trigger circuit 504 are used to drive a power FET or other transistor that controls operation of a circuit other than an H-bridge circuit, such as a DC-DC power converter. In some examples, such a DC-DC power converter includes a high side FET and a low side FET. In some examples, such a DC-DC power converter is operated so that an operation cycle of the converter includes: the high side FET is on and the low side FET is off, then both FETS are turned off in a first dead time, then the low side FET is turned off and the high side FET is off, then both FETS are turned off in a second dead time.

In some examples, a low side FET 208 is driven low using switches or current mirrors that are made up of n-channel MOSFETS or NPN-type bipolar junction transistors.

In some examples, $V_{GS(LS)}$, and a corresponding current charging (or discharging) $C_{GD}$, varies during the dV/dt phase.

In some examples, a gate driver 114 or 118 for a low side FET 208 includes one or more of the pull-down circuit 502 and the voltage trigger circuit 504.

In some examples, one or more of $DV_{DD}$, CONTROL1, CONTROL2, $V_{TRIGGER1}$, or $V_{TRIGGER2}$ are provided by the control circuit 120.

In some examples, the control circuit 120 includes the voltage trigger circuit 504 and/or the comparator 523. In some examples, the gate driver 114 includes portions of the pull-down circuit 502 and/or the voltage trigger circuit 504 other than portions included in the control circuit 120.

In some examples, the three phase process for turning off a low side FET 208 is controlled by the control circuit 120 as follows: in a first phase, the control circuit 120 maintains M2N 520 and M3N 522 in an on state and the switch 516 in a closed state; in a second phase after the first phase, the control circuit 120 maintains M2N 520 and M3N 522 in the on state and opens the switch 516 to an open state; and in a third phase after the second phase, the control circuit 120 maintains M2N 520 in the on state and the switch 516 in the open state, and turns off M3N 522 to an off state.

In some examples, a current mirror can be modeled as having a first terminal corresponding to a source-drain path of a first transistor, a second terminal corresponding to a source-drain path of a second transistor, and a ground terminal corresponding to a low reference voltage side of the source-drain paths of the first and second transistors.

In some examples, one or more of the pull-down circuit 502, the voltage trigger circuit 504, and/or the low side FET 208 are manufactured on a same IC. In some examples, more than one of the power FETS 104, 106, 108, or 110 is included on the IC. In some examples, the inductive load 102 is included on the IC. In some examples, the IC and/or one or more of these components is included on a printed circuit board (PCB). In some examples, components that are not included on the same IC and that are described as connected are connected by traces on the PCB.

In some examples, such as in an IC, resistor and capacitor values are selected based on areas of the respective components.

In some examples, the first resistor 512 and the switch 516 can be replaced by a current source having variable drive strength. During periods when the switch 516 would be closed, the current source would drive a relatively large current. During periods when the switch 516 would be open, the current source strength would be reduced to imitate the weak pull-up provided by the signal path from voltage source 506, through the first resistor 512, to the gate of M2N 520. In some examples, the current source can be implemented using a current mirror.

Herein, devices that have been described as n-channel or p-channel devices may be replaced, respectively, with p-channel or n-channel devices, with appropriate rearrangement of circuitry to accomplish similar functionality to that described above.

The term "couple" is used throughout the specification. The term may cover connections, communications, or signal paths that enable a functional relationship consistent with this description. For example, if device A provides a signal to control device B to perform an action, in a first example device A is coupled to device B, or in a second example device A is coupled to device B through intervening component C if intervening component C does not substantially alter the functional relationship between device A and device B such that device B is controlled by device A via the control signal provided by device A.

In this description, the term "and/or" (when used in a form such as A, B and/or C) refers to any combination or subset of A, B, C, such as: (a) A alone; (b) B alone; (c) C alone; (d) A with B; (e) A with C; (f) B with C; and (g) A with B and with C. Also, as used herein, the phrase "at least one of A or B" (or "at least one of A and B") refers to implementations including any of: (a) at least one A; (b) at least one B; and (c) at least one A and at least one B.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

As used herein, the terms "terminal", "node", "interconnection", "pin", "ball" and "lead" are used interchangeably. Unless specifically stated to the contrary, these terms are generally used to mean an interconnection between or a terminus of a device element, a circuit element, an integrated circuit, a device or other electronics or semiconductor component.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

While the use of particular transistors are described herein, other transistors (or equivalent devices) may be used instead with little or no change to the remaining circuitry. For example, a MOSFET (such as an n-channel MOSFET, nMOSFET, or a p-channel MOSFET, pMOSFET), a bipolar junction transistor (BJT—e.g. NPN or PNP), insulated gate bipolar transistors (IGBTs), and/or junction field effect transistor (JFET) may be used in place of or in conjunction with the devices disclosed herein. The transistors may be depletion mode devices, drain-extended devices, enhancement mode devices, natural transistors or other type of device structure transistors. Furthermore, the devices may be implemented in/over a silicon substrate (Si), a silicon carbide substrate (SiC), a gallium nitride substrate (GaN) or a gallium arsenide substrate (GaAs). Also, a control terminal in a FET corresponds to a base on a BJT or a gate or other corresponding structure in an other type of transistor.

Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

While certain elements of the described examples may be included in an integrated circuit and other elements are external to the integrated circuit, in other example embodiments, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. Unless otherwise stated, "about," "approximately," or "substantially" preceding a value means+/−10 percent of the stated value, or, if the value is zero, a reasonable range of values around zero.

Modifications are possible in the described examples, and other examples are possible within the scope of the claims.

What is claimed is:

1. An integrated circuit (IC) comprising:
   a first transistor having a first terminal, a second terminal, and a control terminal;
   a second transistor having a first terminal, a second terminal, and a control terminal;
   a switch having a first terminal, a second terminal, and a control input;
   a first comparator having first and second inputs and an output, the first comparator configured to receive a first reference voltage at the first input, wherein the output of the first comparator is coupled to the control terminal of the second transistor; and a second comparator having first and second inputs and an output, the second comparator configured to receive a second reference voltage at the first input of the second comparator, the second input of the second comparator coupled to the second input of the first comparator, and the output of the second comparator coupled to the control input of the switch;

wherein the first comparator includes:

a third transistor having a first terminal, a second terminal, and a control terminal, the second terminal of the third transistor coupled to the second input of the first comparator;

a fourth transistor having a first terminal, a second terminal, and a control terminal, the first terminal of the fourth transistor coupled to the first terminal of the third transistor, and the control terminals of the third and fourth transistors configured to receive the first reference voltage; and a current mirror having a first terminal, a second terminal, and a ground terminal, the first terminal of the current mirror coupled to the second terminal of the fourth transistor, and the second terminal of the current mirror coupled to the output of the first comparator.

2. An integrated circuit (IC) comprising:

a first transistor having a first terminal, a second terminal, and a control terminal;

a second transistor having a first terminal, a second terminal, and a control terminal;

a switch having a first terminal, a second terminal, and a control input;

a first comparator having first and second inputs and an output, the first comparator configured to receive a first reference voltage at the first input, wherein the output of the first comparator is coupled to the control terminal of the second transistor;

a second comparator having first and second inputs and an output, the second comparator configured to receive a second reference voltage at the first input of the second comparator, the second input of the second comparator coupled to the second input of the first comparator, and the output of the second comparator coupled to the control input of the switch; and a low side transistor having a first terminal, a second terminal, and a control terminal, the second terminal of the low side transistor coupled to the second inputs of the first and second comparators, the control terminal of the low side transistor coupled to the second terminals of the first and second transistors, and the first terminal of the low side transistor coupled to the first terminals of the first and second transistors.

3. The IC of claim 2, further including a ground connection;

wherein the first terminal of the low side transistor is adapted to be coupled to ground via the ground connection.

4. The IC of claim 3, wherein the ground connection includes an inductive connection.

5. The IC of claim 2, wherein the first comparator includes:

a third transistor having a first terminal, a second terminal, and a control terminal, the second terminal of the third transistor coupled to the second input of the first comparator;

a fourth transistor having a first terminal, a second terminal, and a control terminal, the first terminal of the fourth transistor coupled to the first terminal of the third transistor, and the control terminals of the third and fourth transistors configured to receive the first reference voltage; and a current mirror having a first terminal, a second terminal, and a ground terminal, the first terminal of the current mirror coupled to the second terminal of the fourth transistor, and the second terminal of the current mirror coupled to the output of the first comparator.

6. The IC of claim 2, wherein the low side transistor is a power field effect transistor (FET).

7. An integrated circuit (IC) comprising:

a first transistor having a first terminal, a second terminal, and a control terminal;

a second transistor having a first terminal, a second terminal, and a control terminal;

a switch having a first terminal, a second terminal, and a control input;

a first comparator having first and second inputs and an output, the first comparator configured to receive a first reference voltage at the first input, wherein the output of the first comparator is coupled to the control terminal of the second transistor;

a second comparator having first and second inputs and an output, the second comparator configured to receive a second reference voltage at the first input of the second comparator, the second input of the second comparator coupled to the second input of the first comparator, and the output of the second comparator coupled to the control input of the switch;

an inverter having an input and an output;

a capacitor having first and second terminals;

a resistor having first and second terminals, the first terminal of the switch coupled to the first terminal of the resistor, and the second terminal of the switch coupled to the second terminal of the resistor, the first terminal of the capacitor, and the control terminal of the first transistor;

a third transistor having a first terminal, a second terminal, and a control terminal, the second terminal of the third transistor coupled to the first terminal of the resistor and the first terminal of the switch; and a fourth transistor including a first terminal, a second terminal, and a control terminal, the first terminal of the fourth transistor coupled to a ground connection, the control terminal of the fourth transistor coupled to the control terminal of the third transistor and the output of the inverter, and the second terminal of the fourth transistor coupled to the second terminal of the resistor, the second terminal of the switch, the first terminal of the capacitor, and the control terminal of the first transistor.

8. An integrated circuit (IC) comprising:

a turn off circuit including:

a first transistor including a first terminal, a second terminal, and a control terminal;

a second transistor including a first terminal, a second terminal, and a control terminal; and a switch including first and second terminals; and a low side power field-effect transistor (FET) and a high side power FET each including a first terminal, a second terminal, and a control terminal, the second terminal of the low side power FET coupled to the first terminal of the high side power FET, the control terminal of the low side power FET coupled to the second terminals of the first and second transistors, and the first terminal of the low side power FET coupled to the first terminals of the first and second transistors;

wherein the turn off circuit is configured to turn off the low side power FET by:

in a first phase, maintaining the first and second transistors in an on state and the switch in a closed state;

in a second phase after the first phase, maintaining the first and second transistors in the on state and opening the switch to an open state; and in a third phase after the second phase, maintaining the first transistor in the on state and the switch in the open state, and turning off the second transistor to an off state.

9. The IC of claim 8, wherein the turn off circuit is configured to transition from operating in the first phase to operating in the second phase before a dI/dt phase of turning off the low side power FET begins, and after a voltage at the second terminal of the low side power FET starts to increase.

10. The IC of claim 8, wherein the turn off circuit is configured to transition from operating in the second phase to operating in the third phase before a dI/dt phase of turning off the low side power FET begins.

11. The IC of claim 8, wherein the switch includes a control input, and the IC further comprising:

a first comparator including a first input, a second input, and an output, the first input of the first comparator coupled to the second terminal of the low side power FET, and the output of the first comparator coupled to the control input of the switch; and a second comparator including a first input, a second input, and an output, the first input of the second comparator coupled to the second terminal of the low side power FET, and the output of the first comparator coupled to the control terminal of the second transistor.

12. The IC of claim 11, wherein the second comparator is configured to receive at the second input a voltage selected in response to a slew rate of a voltage at the second terminal of the low side power FET during a dV/dt phase of turning off the low side power FET, a response rate of the second comparator, and a turn off rate of the second transistor.

13. The IC of claim 11, further comprising:

an inverter having an input and an output;

a capacitor having first and second terminals; and a resistor having first and second terminals, the first terminal of the switch coupled to the first terminal of the resistor, and the second terminal of the switch coupled to the second terminal of the resistor, the first terminal of the capacitor, and the control terminal of the first transistor;

a third transistor having a first terminal, a second terminal, and a control terminal, the second terminal of the third transistor coupled to the first terminal of the resistor and the first terminal of the switch; and a fourth transistor having a first terminal, a second terminal, and a control terminal, the first terminal of the fourth transistor coupled to a ground connection, the control terminal of the fourth transistor coupled to the control terminal of the third transistor and the output of the inverter, and the second terminal of the fourth transistor coupled to the second terminal of the resistor, the second terminal of the switch, the first terminal of the capacitor, and the control terminal of the first transistor.

14. A system comprising:

a first transistor having a source, a drain, and a gate;

a second transistor having a source, a drain, and a gate;

a high side power field-effect transistor (FET) having a source, a drain, and a gate, the drain of the high side power FET adapted to be coupled to a voltage source;

a low side power FET having a source, a drain, and a gate, the drain of the low side power FET coupled to the source of the high side power FET, the gate of the low side power FET coupled to the drains of the first and second transistors, and the source of the low side power FET adapted to be coupled to a ground connection and the sources of the first and second transistors;

a switch having first and second terminals, and a control input;

a first comparator having first and second inputs and an output, the first comparator configured to receive at the first input a first reference voltage, and the output of the first comparator coupled to the gate of the second transistor; and a second comparator having first and second inputs and an output, the second comparator configured to receive at the first input a second reference voltage, the second input of the second comparator coupled to the second input of the first comparator, and the output of the second comparator coupled to the control input of the switch.

15. The system of claim 14, wherein the high side power FET and the low side power FET are part of a DC-DC converter or an H-bridge circuit.

16. The system of claim 14, wherein the high side power FET is a first high side power FET and the low side power FET is a first low side power FET, and the system further comprising:

a second high side power FET having a source, a drain, and a gate; and a second low side power FET having a source, a drain, and a gate, the drain of the second low side power FET coupled to the source of the first high side power FET.

17. The system of claim 14, wherein the first comparator includes:

a third transistor having a source, a drain, and a gate, the drain of the third transistor coupled to the second input of the first comparator;

a fourth transistor having a source, a drain, and a gate, the source of the fourth transistor coupled to the source of the third transistor, and the gates of the third and fourth transistors coupled to the first input of the first comparator; and a current mirror having a first terminal, a second terminal, and a ground terminal, the first terminal of the current mirror coupled to the drain of the fourth transistor, and the second terminal of the current mirror coupled to the output of the first comparator.

18. The system of claim 17, further comprising a ground, wherein the source of the low side power FET is coupled to ground via the ground connection, and wherein the ground connection is an inductive connection.

19. The system of claim 18, further comprising:

an inverter having an input and an output;

a capacitor having first and second terminals;

a resistor having first and second terminals, the first terminal of the switch coupled to the first terminal of the resistor, and the second terminal of the switch coupled to the second terminal of the resistor, the first terminal of the capacitor, and the gate of the first transistor;

a third transistor having a source, a drain, and a gate, the drain of the third transistor coupled to the first terminal of the resistor and the first terminal of the switch; and a fourth transistor having a source, a drain, and a gate, the source of the fourth transistor coupled to the ground connection, the gate of the fourth transistor coupled to the gate of the third transistor and the output of the inverter, and the drain of the fourth transistor coupled to the second terminal of the resistor, the second terminal of the switch, the first terminal of the capacitor, and the gate of the first transistor.

20. The system for controlling power of claim 19, further including a control circuit configured to:

in a first phase, maintain the first and second transistors in an on state and the switch in a closed state;

in a second phase after the first phase, maintain the first and second transistors in the on state and open the switch to an open state; and in a third phase after the second phase, maintain the first transistor in the on state and the switch in the open state, and turn off the second transistor to an off state.

* * * * *